(12) United States Patent
Osanai et al.

(10) Patent No.: US 7,255,931 B2
(45) Date of Patent: Aug. 14, 2007

(54) ALUMINUM/CERAMIC BONDING SUBSTRATE AND METHOD FOR PRODUCING SAME

(75) Inventors: Hideyo Osanai, Shiojiri (JP); Satoru Ideguchi, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/955,172

(22) Filed: Sep. 29, 2004

(65) Prior Publication Data

US 2005/0072547 A1 Apr. 7, 2005

(30) Foreign Application Priority Data

| Sep. 29, 2003 | (JP) | ............................ 2003-337106 |
| Mar. 8, 2004 | (JP) | ............................ 2004-063621 |

(51) Int. Cl.
 *B32B 15/20* (2006.01)
 *B32B 15/00* (2006.01)
 *B32B 15/04* (2006.01)

(52) U.S. Cl. .................... 428/650; 428/457; 428/545; 428/689

(58) Field of Classification Search ..................... None
See application file for complete search history.

(56) References Cited

U.S. PATENT DOCUMENTS

| 5,484,493 | A | * | 1/1996 | Young et al. ................ 148/437 |
| 5,965,193 | A | * | 10/1999 | Ning et al. ............... 427/126.4 |
| 6,123,895 | A | * | 9/2000 | Yamagata et al. ............ 419/13 |
| 6,426,154 | B1 | * | 7/2002 | Naba et al. .................. 428/620 |
| 6,912,130 | B2 | * | 6/2005 | Osanai et al. ............... 361/699 |
| 6,938,333 | B2 | * | 9/2005 | Osanai et al. .................. 29/830 |
| 2004/0074951 | A1 | * | 4/2004 | Takahashi et al. .......... 228/219 |
| 2005/0214518 | A1 | * | 9/2005 | Nagase et al. .............. 428/210 |

FOREIGN PATENT DOCUMENTS

| EP | 1 187 198 | 3/2002 |
| EP | 1 237 397 | 9/2002 |

(Continued)

OTHER PUBLICATIONS

JP 09-315875 English Machine Translation, Aluminum-ceramic Composite Substrate and its Production, Dec. 1997.*

*Primary Examiner*—Jennifer McNeil
*Assistant Examiner*—Jason L. Savage
(74) *Attorney, Agent, or Firm*—Bachman & LaPointe, P.C.

(57) ABSTRACT

When an aluminum plate is bonded directly to a ceramic substrate by cooling and solidifying molten aluminum which is injected into a mold so as to contact the ceramic substrate arranged in the mold, an additive, such as a TiB alloy, Ca or Sr, for decreasing the grain size of the aluminum plate to 10 mm or less while preventing the drop in thermal conductivity of the aluminum plate from the thermal conductivity of a pure aluminum plate from exceeding 20% of the thermal conductivity of the pure aluminum plate is added to the molten aluminum. When an aluminum alloy plate of an aluminum-silicon alloy is bonded directly to a ceramic substrate by cooling and solidifying a molten aluminum-silicon alloy which is injected into a mold so as to contact the ceramic substrate arranged in the mold, an aluminum-silicon alloy containing 0.1 to 1.5 wt % of silicon and 0.03 to 0.10 wt % of boron is injected into the mold.

6 Claims, 2 Drawing Sheets

FOREIGN PATENT DOCUMENTS

| | | |
|---|---|---|
| EP | 1 562 411 | 8/2005 |
| JP | 09-315875 | * 12/1997 |
| JP | 2002-76551 | 3/2002 |
| JP | 2002-329814 | 11/2002 |
| WO | WO 03/090277 | 4/2003 |

* cited by examiner

ALUMINUM/CERAMIC BONDING SUBSTRATE AND METHOD FOR PRODUCING SAME

BACKGROUND OF THE INVENTION

1. Field of the Invention

The present invention generally relates to an aluminum/ceramic bonding substrate and a method for producing the same. More specifically, the invention relates to an aluminum/ceramic bonding substrate wherein an aluminum member is bonded to at least one side of a ceramic substrate, and a method for producing the same.

2. Description of the Prior Art

In recent years, power modules are used for controlling heavy-current for electric vehicles, electric railcars, machine tools and so forth. In a conventional power module, a metal/ceramic insulating substrate is fixed to one side of a metal plate or compound material called base plate by soldering, and one or a plurality of semiconductor chips are fixed to the metal/ceramic insulating substrate by soldering. On the other side (reverse) of the base plate, a radiating fin or cooling jacket of a metal is mounted via a thermal conduction grease by means of screws.

Since the soldering of the base plate and semiconductor chip(s) on the metal/ceramic insulating substrate is carried out by heating, the base plate is easy to warp due to the difference in coefficient of thermal expansion between bonded members during soldering. Heat generated from the semiconductor chip(s) passes through the metal/ceramic insulating substrate, solder and base plate to be radiated from the radiating fin or cooling jacket to air or cooling water. Therefore, if the base plate warps during soldering, when the radiating fin or cooling jacket is mounted on the base plate, the clearance therebetween increases, so that there is a problem in that the heat sink characteristic of the base plate extremely deteriorates.

In order to solve such a problem to enhance the reliability of the metal/ceramic insulating substrate, there is proposed a metal/ceramic circuit board which uses a base plate of aluminum having a very low yield stress, e.g., a metal/ceramic circuit board wherein a base plate of aluminum or an aluminum alloy having a proof stress of 320 MPa or less and having a thickness of 1 mm or more is bonded directly to a ceramic substrate by a so-called molten metal bonding method (see, e.g., Japanese Patent Laid-Open No. 2002-76551).

In order to decrease the yield stress of aluminum, it is required to increase the purity of aluminum. However, in the molten metal bonding method, it is difficult to control the grain size of aluminum, so that the obtained grain size of aluminum is a large grain size of 10 mm or more. If the grain size of aluminum is so large, the grain size distribution of aluminum varies. Thus, cracks are easily produced in the ceramic substrate after heat cycles, and the behavior of warpage of the aluminum base plate varies due to heat when semiconductor chips are soldered thereon.

In recent years, as an insulating substrate for a reliable power module for controlling heavy-current for electric vehicles, machine tools and so forth, there is used an aluminum/ceramic bonding substrate wherein an aluminum member is bonded to a ceramic substrate.

However, in a conventional aluminum/ceramic bonding substrate, if an aluminum member is plated with nickel or the like to bond thereon a heat sink plate, such as a copper plate, via solder, there are some cases where cracks are produced in the solder by heat cycles, so that the heat sink characteristic of the heat sink plate deteriorates. It is considered that such solder cracks are produced in the relatively weak solder layer by stress which is produced on the bonding interface by heat cycles due to the difference in coefficient of thermal expansion between the aluminum member and the solder.

In order to eliminate such a problem, it is known that an aluminum alloy member of an aluminum-silicon alloy is used as the aluminum member (see Japanese Patent Laid-Open No. 2002-329814).

However, when an aluminum alloy member of an aluminum-silicon alloy, particularly an aluminum alloy containing 0.1 to 1.5 wt % of silicon, is bonded to a ceramic substrate by the molten metal bonding method, if the current cooling method is used, it is very difficult to decrease the grain size of the alloy by optimizing usual cooling conditions, and it is very difficult to control the formation of a solid solution of silicon in aluminum. Thus, there is a problem in that the enriching section of silicon exists in the aluminum alloy member. In particular, it is considered that the eutectic of Al—Si or a composition approximating it exists in the grain boundary portions. Thus, there are some cases where hot cracks are produced in the aluminum alloy member during the cooling process, so that the aluminum/ceramic bonding substrate does not function as a normal aluminum/ceramic bonding substrate. In addition, if etching is carried out for forming a circuit on the aluminum alloy member, there are some cases where the enriching section of silicon remains on the surface of the ceramic substrate without being dissolved, so that it is not possible to obtain the desired insulating characteristics of the aluminum/ceramic bonding substrate.

SUMMARY OF THE INVENTION

It is therefore an object of the present invention to eliminate the aforementioned problems and to provide an aluminum/ceramic bonding substrate capable of decreasing the grain size of aluminum to decrease the variation in grain size distribution to prevent cracks from being produced in a ceramic substrate after heat cycles, and of controlling the warpage of an aluminum base plate due to heat when a semiconductor chip or the like is soldered thereon, to inhibit the heat sink characteristic of the aluminum base plate from deteriorating when a radiating fin or the like is mounted thereon, and a method for producing the same.

In order to accomplish the aforementioned and other objects, the inventors have diligently studied and found that, if an additive for decreasing the grain size of an aluminum member to 10 mm or less while preventing a drop in thermal conductivity of the aluminum member from the thermal conductivity of a member of pure aluminum from exceeding 20% of the thermal conductivity of the member of pure aluminum is added to molten aluminum when the aluminum member is bonded to a ceramic substrate by the molten metal bonding method, it is possible to decrease the grain size of the aluminum member to decrease the variation in grain size distribution of the aluminum member to prevent cracks from being produced in the ceramic substrate after heat cycles, and it is possible to control the warpage of an aluminum base member due to heat when a semiconductor chip or the like is soldered thereon, so that it is possible to inhibit the heat sink characteristic of the aluminum base member from deteriorating when a radiating fin or the like is mounted on the aluminum base member.

It is another object of the present invention to provide an aluminum/ceramic bonding substrate having good insulating characteristics by decreasing the grain size of an aluminum-silicon alloy of an aluminum alloy member, which is bonded to a ceramic substrate, to prevent the macroscopic segregation of silicon to prevent silicon from remaining on the surface of the ceramic substrate, and a method for producing same. It is a further object of the present invention to provide an aluminum/ceramic bonding substrate capable of preventing solder cracks from being produced by heat cycles and of preventing the heat sink characteristic of the substrate from deteriorating, even if a heat sink plate is soldered thereon, and a method for producing the same.

In order to accomplish the aforementioned and other objects, the inventors have diligently studied and found that it is possible to decrease the grain size of an aluminum-silicon alloy to increase the number of grain boundary portions thereof if boron is added to the aluminum-silicon alloy as a third element.

According to one aspect of the present invention, there is provided a method for producing an aluminum/ceramic bonding substrate wherein an aluminum member is bonded directly to a ceramic substrate, the method comprising the steps of: preparing an additive for decreasing a grain size of an aluminum member to 10 mm or less while preventing a drop in thermal conductivity of the aluminum member from a thermal conductivity of a member of pure aluminum from exceeding 20% of the thermal conductivity of the member of pure aluminum; arranging a ceramic substrate in a mold; adding the additive to molten aluminum which is injected into the mold so as to contact one side of the ceramic substrate; and cooling the mold to solidify the molten aluminum to form an aluminum member on the one side of the ceramic substrate so that the aluminum member is bonded directly to the one side of the ceramic substrate.

In this method, the additive preferably prevents the drop in thermal conductivity of the aluminum member from exceeding 10% of the thermal conductivity of the member of pure aluminum. The additive preferably decreases the grain size of the aluminum member to 3 mm or less. The additive may be an alloy containing titanium and boron. In this case, the alloy containing titanium and boron is preferably added so that titanium has a content of 0.05 to 1.0 wt %, and more preferably added so that titanium has a content of 0.1 to 0.5 wt %. The additive may be calcium, strontium or aluminum nitride. In this case, the additive preferably has a content of 0.3 to 0.7 wt %. The additive may be an element selected from the group consisting of copper, silicon, magnesium, nickel, zinc, chromium, manganese, vanadium, zirconium and titanium.

According to another aspect of the present invention, an aluminum/ceramic bonding substrate comprises: a ceramic substrate; and an aluminum member bonded to the ceramic substrate, the aluminum member including an additive and having a thermal conductivity which is 80% or more of a thermal conductivity of a member of pure aluminum, and the aluminum member having a grain size of 10 mm or less.

In this aluminum/ceramic bonding substrate, the thermal conductivity of the aluminum member is preferably 90% or more of the thermal conductivity of the member of pure aluminum, and the grain size of the aluminum member is preferably 3 mm or less. The additive may be an alloy containing titanium and boron. In this case, the aluminum member preferably contains 0.05 to 1.0 wt % of titanium, and more preferably contains 0.1 to 0.5 wt % of titanium. The additive may be calcium, strontium or aluminum nitride. In this case, the additive preferably has a content of 0.3 to 0.7 wt %. The additive may be an element selected from the group consisting of copper, silicon, magnesium, nickel, zinc, chromium, manganese, vanadium, zirconium and titanium. The aluminum member may be bonded directly to the ceramic substrate by cooling molten aluminum which contacts the ceramic substrate.

According to another aspect of the present invention, an aluminum/ceramic bonding substrate comprises: a ceramic substrate; and an aluminum alloy member of an aluminum-silicon alloy bonded to the ceramic substrate, the aluminum-silicon alloy containing boron.

In this aluminum/ceramic bonding substrate, the aluminum-silicon alloy preferably contains 0.1 to 1.5 wt % of silicon, and more preferably contains 0.2 to 1.0 wt % of silicon. The aluminum-silicon alloy preferably contains 0.02 wt % or more of boron, and more preferably contains 0.03 to 0.10 wt % of boron. All or part of a surface of the aluminum alloy member may be plated with nickel or a nickel alloy.

According to a further aspect of the present invention, there is provided a method for producing an aluminum/ceramic bonding substrate wherein an aluminum alloy member is bonded directly to a ceramic substrate, the method comprising the steps of: arranging a ceramic substrate in a mold; injecting a molten aluminum-silicon alloy containing boron into the mold so that the molten aluminum-silicon alloy contacts one side of the ceramic substrate; and cooling the mold to solidify the molten aluminum-silicon alloy to form an aluminum alloy member on the one side of the ceramic substrate so that the aluminum alloy member is bonded directly to the one side of the ceramic substrate.

In this method, the aluminum-silicon alloy preferably contains 0.1 to 1.5 wt % of silicon, and more preferably contains 0.2 to 1.0 wt % of silicon. The aluminum-silicon alloy preferably contains 0.02 wt % or more of boron, and more preferably contains 0.03 to 0.10 wt % of boron.

According to a still further aspect of the present invention, a power module uses any one of the above described aluminum/ceramic bonding substrates.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

First Preferred Embodiment

Figure 1:
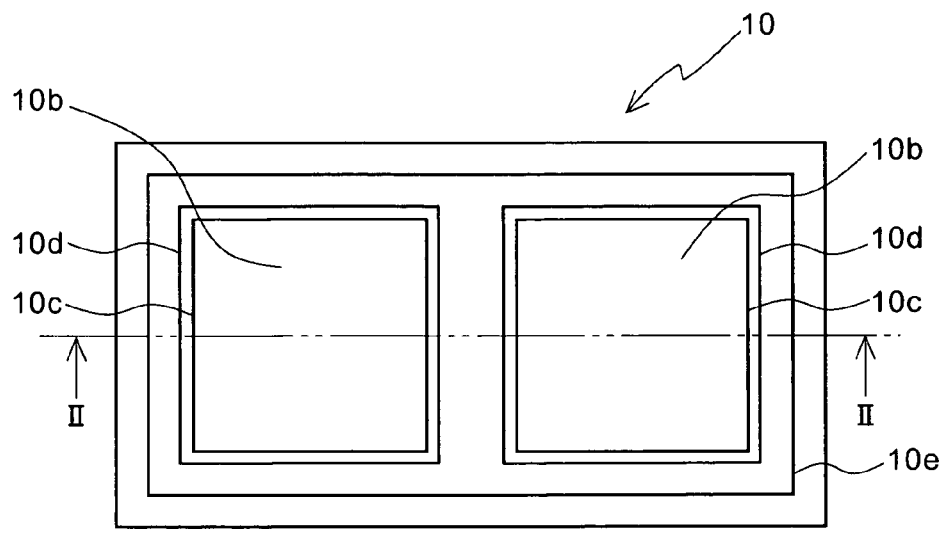
FIG. 1 is a plan view of a lower mold member of a mold used in Examples of the first preferred embodiment of a method for producing an aluminum/ceramic bonding substrate according to the present invention.

In the first preferred embodiment of a method for producing an aluminum/ceramic bonding substrate according to the present invention, an aluminum member is bonded directly to one side of a ceramic substrate by cooling and solidifying molten aluminum which is injected into a mold so as to contact the one side of the ceramic substrate, and an additive for decreasing the grain size of the aluminum member to 10 mm or less while preventing a drop in thermal conductivity of the aluminum member from the thermal conductivity of a member of pure aluminum from exceeding 20% of the thermal conductivity of the member of pure aluminum is added to the molten aluminum to be injected into the mold. By adding such an additive to the molten aluminum, it is possible to decrease the grain size of the aluminum member to decrease the variation in grain size distribution of the aluminum member to prevent cracks from being produced in the ceramic substrate after heat cycles, and it is possible to control the warpage of an aluminum base plate due to heat when a semiconductor chip or the like is soldered thereon, so that it is possible to inhibit the heat sink characteristic of the aluminum base plate from deteriorating when a radiating fin or the like is mounted thereon.

It is considered that the reasons why it is possible to prevent cracks from being produced in a ceramic substrate after heat cycles by decreasing the grain size of an aluminum member are as follows. Heat cycles cause thermal stress due to the difference in thermal expansion between ceramic and aluminum of an aluminum/ceramic bonding substrate. Then, the aluminum base plate and aluminum circuit plate bonded to the ceramic substrate are plastically deformed to relax stress since solid aluminum is a soft metal. At this time, distortion concentrates on the grain boundary portions of easily deformed aluminum to cause a difference in level on the grain boundary portions of aluminum. If the grain size of aluminum is small, the difference in level disperses so as to be small. However, if the grain size of aluminum is large, the grain boundary portions are short, so that the difference in level is large. Since stress is easy to concentrate on the large difference in level, it is considered that great force is applied to the portions having the large difference in level, so that cracks are easily produced in a corresponding portion of the ceramic substrate. The difference in level is preferably 100 μm or less, and more preferably 50 μm or less, after 3000 heat cycles or more. If the difference in level is 300 μm or more, cracks are more easily produced, and if the ceramic substrate is thin, cracks are remarkably produced.

It is known that the grain size of aluminum decreases if an additive is added thereto or if the solidifying rate thereof during casting is increased. However, if the solidifying rate is increased, large thermal shocks are applied to the ceramic substrate, so that the ceramic substrate is easily cracked. Therefore, the inventor has diligently studied to decrease the grain size of aluminum by adding an additive thereto, and found that, when an aluminum/ceramic bonding substrate is used as a heavy current passing substrate, such as a circuit board for a power module, unless a drop in thermal conductivity is 20% or less of the thermal conductivity of pure aluminum when an additive is added to decrease the grain size of aluminum, the heat sink characteristic of a power module is insufficient, and the loss of electric conduction is so large as to be undesired.

In order to inhibit cracks from being produced in a ceramic substrate after heat cycles, the grain size of aluminum is preferably 10 mm or less, and more preferably 3 mm or less.

It is known that elements, such as copper (Cu), silicon (Si), magnesium (Mg), nickel (Ni), zinc (Zn), chromium (Cr), manganese (Mn), vanadium (V), zirconium (Zr) and titanium (Ti), are used as the additive to an aluminum alloy. If an additive satisfies the above described conditions, any one of the above described elements may be used as the additive.

When a method for bonding aluminum to a ceramic substrate is the molten metal bonding method, an additive, such as TiB, aluminum nitride (AlN), calcium (Ca) or strontium (Sr), is preferably used, since it is difficult to form a solid solution of such an additive in aluminum and since such an additive can obtain an alloy having a low yield strength. In this case, the additive is preferably added in the form of a base material, such as Al—Ti—B, Al—Si or Al—Ca.

When the molten aluminum is cooled to be solidified, the cooling rate is preferably such a cooling rate that it is possible to inhibit thermal shocks from being applied to the ceramic substrate to prevent cracks from being produced in the ceramic substrate and that it is difficult to increase the grain size of aluminum. For example, the cooling rate is preferably in the range of from 10 to 100° C./min., and more preferably in the range of from 20 to 50° C./min.

The method for bonding aluminum to the ceramic substrate may be a so-called brazing filler metal bonding method for bonding aluminum to a ceramic substrate via a brazing filler metal, or a so-called direct bonding method for bonding aluminum directly to a ceramic substrate.

Referring now to the accompanying drawings, Examples in the first preferred embodiment of an aluminum/ceramic bonding substrate and a method for producing the same according to the present invention will be described below.

EXAMPLE 1

Figure 2:
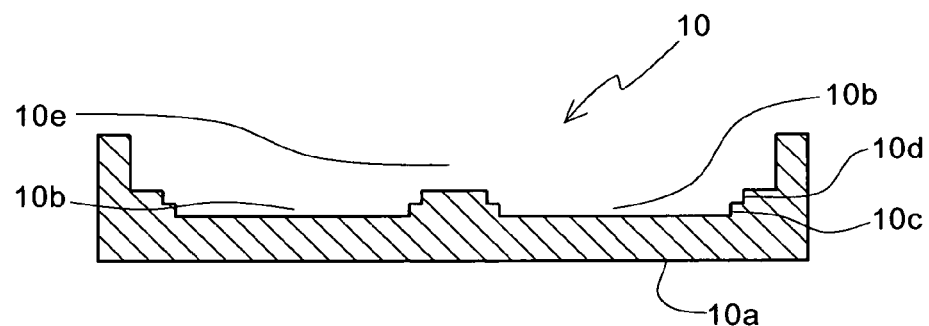
FIG. 2 is a sectional view of the lower mold member taken along line II-II of FIG. 1.

First, as shown in FIGS. 1 and 2, a carbon mold having a lower mold member 10 was prepared as a mold. The lower mold member 10 has a bottom portion 10a having a substantially rectangular planar shape. The top surface of the bottom portion 10a of the lower mold member 10 has two recessed portions 10b which are spaced from each others by 10 mm and each of which has a step-wise extending side wall. Each of the recessed portions 10b comprises: an aluminum plate forming portion 10c capable of forming an aluminum plate having a size of 39 mm×39 mm×0.4 mm; and a ceramic substrate housing portion 10d which is formed above the aluminum plate forming portion 10c so as to be adjacent thereto and which substantially has the same shape and size as those of a ceramic substrate having a size of 40 mm×40 mm×0.635 mm so as to be capable of housing therein the ceramic substrate. When an upper mold member (not shown) having a substantially rectangular planar shape is put on the lower mold member 10, there is formed an aluminum base plate forming portion 10e having such a shape and size that an aluminum base plate having a size of 110 mm×60 mm×6 mm can be formed on the ceramic substrate so as to be adjacent thereto. Furthermore, the upper mold member of the mold has a molten metal inlet (not shown) for injecting molten aluminum into the mold. The lower mold member 10 has a molten metal passage (not shown) extending between the aluminum base plate forming portion 10e and the aluminum plate forming portion 10c, so as to allow the aluminum base plate forming portion 10e to be communicated with the aluminum plate forming portion 10c if the ceramic substrate is housed in the ceramic substrate housing portion 10d.

Figure 3:
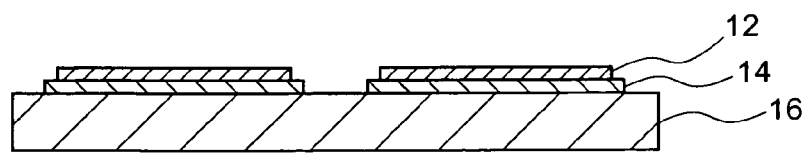
FIG. 3 is a sectional view of an aluminum/ceramic bonding substrate produced by the mold of FIG. 1.
Figure 4:
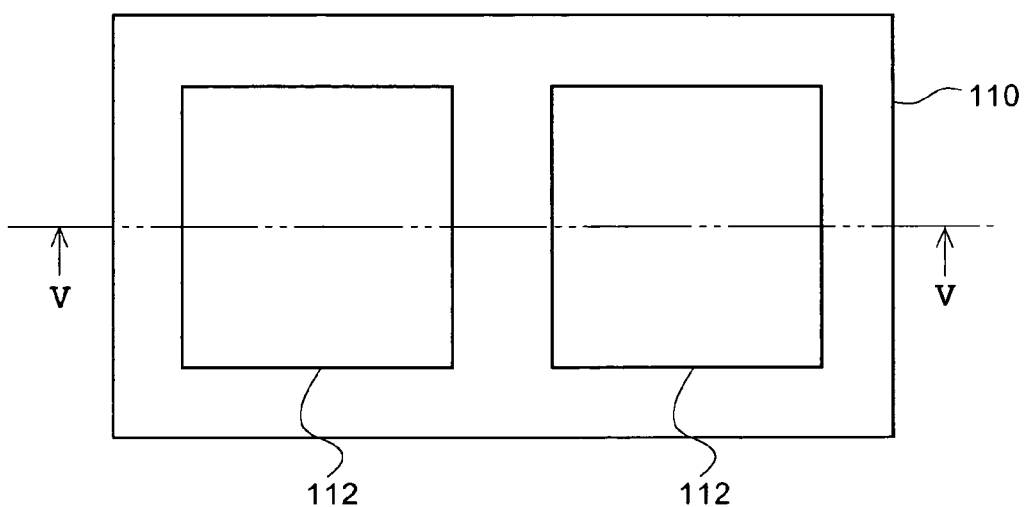
FIG. 4 is a plan view of the second preferred embodiment of an aluminum/ceramic bonding substrate according to the present invention.
Figure 5:
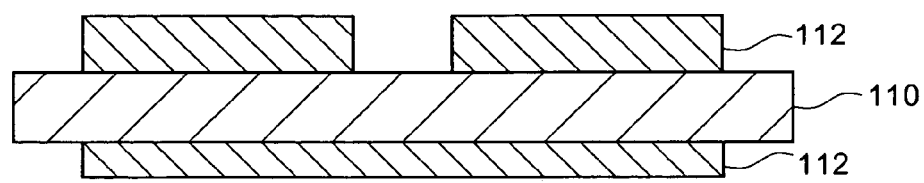
FIG. 5 is a sectional view taken along line V-V of FIG. 4.

Then, two aluminum nitride substrates having a size of 40 mm×40 mm×0.635 mm were housed in the ceramic substrate housing portions 10d of the lower mold member 10 of the mold. Then, the lower mold member 10 was covered with the upper mold member to be put in a furnace, and the atmosphere in the furnace was caused to be a nitrogen atmosphere having an oxygen concentration of 100 ppm or less. In this state, the interior of the mold was heated to 750° C., and a molten Al—Ti—B alloy (Ti: 4.9%, B: 1%, Al: 94.1%) added to molten aluminum having a purity of 4N so as to cause the content of Ti to be 0.5 wt % was injected into the mold while removing oxide films by applying a pressure by means of a carbon cylinder (not shown). Thereafter, the mold was cooled to solidify the molten metal, and further cooled to a room temperature. Thus, as shown in FIG. 3, there was produced a bonding article wherein one side of each of two ceramic substrates 14 was bonded directly to an aluminum base plate 16 having a size of 110 mm×60 mm×6 mm, and one side of an aluminum plate 12 having a size of 39 mm×39 mm×0.4 mm was bonded directly to the other side of each of the ceramic substrates 14, and then, the bonding article was taken out of the mold.

Thereafter, an etching resist having a predetermined shape was printed on the surface of each of the aluminum plates 12 to carry out an etching process with a ferric chloride solution to form a circuit pattern, and then, the resist was removed. In addition, the reverse of the aluminum base plate 16 was ground by 1 mm by milling so that irregularities are 50 μm or less.

After the grain size of aluminum on the reverse of the aluminum base plate 16 of the bonding article thus obtained was observed, the grain size was about 1 to 3 mm.

With respect to the bonding article thus obtained, the bonding interface between the aluminum circuit plate 12 and the ceramic substrate 14 and the bonding interface between the ceramic substrate 14 and the aluminum base plate 16 were examined by an ultrasonic detector. Then, no bonding failure was detected, and no crack was observed on the ceramic substrate 14.

The warpage of the reverse of the aluminum base plate 16 of the obtained bonding article was measured by a warpage measuring device. In addition, after the bonding article was heated to 380° C. to be held for ten minutes, the bonding article was cooled to a room temperature, and then, the warpage of the reverse of the aluminum base plate 16 was measured again by the warpage measuring device. Thus, it was confirm whether the warpage of the reverse of the aluminum base plate 16 was not changed. As a result, the variation in warpage before and after heating was so very small as to be in the range of −10 μm to 20 μm.

With respect to the obtained bonding article, after heat cycles (in each cycle of which the article was held at −40° C. for 30 minutes, at 25° C. for 10 minutes, at 125° C. for 30 minutes, and at 25° C. for 10 minutes) were repeatedly carried out three thousands times, each of the above described bonding interfaces was examined by the ultrasonic detector. Then, no bonding failure was detected, and no crack was observed on the ceramic substrate 14.

The thermal conductivity of a sample having a predetermined size cut out of the obtained bonding article was measured by the laser flash method. As a result, the thermal conductivity was 214 W/mK, and the drop in thermal conductivity from the thermal conductivity (238 W/mK) of pure aluminum was only about 10% of the thermal conductivity of pure aluminum, so that the influence of the additive on the drop in thermal conductivity was weak.

EXAMPLE 2

With respect to a bonding article obtained by the same method as that in Example 1, except that the same Al—Ti—B alloy as that in Example 1 was added so that the content of Ti was 0.1 wt %, the same evaluation as that in Example 1 was carried out. As a result, the grain size of aluminum on the reverse of the aluminum base plate was in the range of from about 3 mm to about 5 mm. In addition, no bonding failure was detected on the bonding interface between the aluminum circuit plate and the ceramic substrate and on the bonding interface between the ceramic substrate and the aluminum base plate, and no crack was observed on the ceramic substrate. In addition, the variation in warpage before and after heating was so small as to be in the range of −20 μm to 30 μm. Also after heat cycles were repeatedly carried out three thousands times, no bonding failure was detected, and no crack was observed on the ceramic substrate. Moreover, the thermal conductivity of a sample cut out of the obtained bonding article was 214 W/mK, and the drop in thermal conductivity from the thermal conductivity (238 W/mK) of pure aluminum was only about 10% of the thermal conductivity of pure aluminum, so that the influence of the additive on the drop in thermal conductivity was weak.

EXAMPLE 3

With respect to a bonding article obtained by the same method as that in Example 1, except that calcium (Ca) was added in place of the Al—Ti—B alloy, the same evaluation as that in Example 1 was carried out. As a result, the grain size of aluminum on the reverse of the aluminum base plate was in the range of from about 5 mm to about 10 mm. In addition, no bonding failure was detected on the bonding interface between the aluminum circuit plate and the ceramic substrate and on the bonding interface between the ceramic substrate and the aluminum base plate, and no crack was observed on the ceramic substrate. In addition, the variation in warpage before and after heating was in the range of −50 μm to 50 μm and was not so great. Also after heat cycles were repeatedly carried out three thousands times, no bonding failure was detected, and no crack was observed on the ceramic substrate. Moreover, the thermal conductivity of a sample cut out of the obtained bonding article was 214 W/mK, and the drop in thermal conductivity from the thermal conductivity (238 W/mK) of pure aluminum was only about 10% of the thermal conductivity of pure aluminum, so that the influence of the additive on the drop in thermal conductivity was weak.

EXAMPLE 4

With respect to a bonding article obtained by the same method as that in Example 1, except that strontium (Sr) was added in place of the Al—Ti—B alloy, the same evaluation as that in Example 1 was carried out. As a result, the grain size of aluminum on the reverse of the aluminum base plate was in the range of from about 5 mm to about 10 mm. In addition, no bonding failure was detected on the bonding interface between the aluminum circuit plate and the ceramic substrate and on the bonding interface between the ceramic substrate and the aluminum base plate, and no crack was observed on the ceramic substrate. In addition, the variation in warpage before and after heating was in the range of −50 μm to 50 μm and was not so great. Also after heat cycles were repeatedly carried out three thousands times, no bonding failure was detected, and no crack was observed on the ceramic substrate. Moreover, the thermal conductivity of a sample cut out of the obtained bonding article was 214 W/mK, and the drop in thermal conductivity from the thermal conductivity (238 W/mK) of pure aluminum was only about 10% of the thermal conductivity of pure aluminum, so that the influence of the additive on the drop in thermal conductivity was weak.

EXAMPLE 5

With respect to a bonding article obtained by the same method as that in Example 1, except that silicon (Si) was added in place of the Al—Ti—B alloy, the same evaluation as that in Example 1 was carried out. As a result, the grain size of aluminum on the reverse of the aluminum base plate was in the range of from about 5 mm to about 10 mm. In addition, no bonding failure was detected on the bonding interface between the aluminum circuit plate and the ceramic substrate and on the bonding interface between the ceramic substrate and the aluminum base plate, and no crack was observed on the ceramic substrate. In addition, the variation in warpage before and after heating was in the range of −50 μm to 50 μm and was not so great. Also after heat cycles were repeatedly carried out three thousands times, no bonding failure was detected, and no crack was observed on the ceramic substrate. Moreover, the thermal conductivity of a sample cut out of the obtained bonding article was 202 W/mK, and the drop in thermal conductivity from the thermal conductivity (238 W/mK) of pure aluminum was only about 15% of the thermal conductivity of pure aluminum, so that the influence of the additive on the drop in thermal conductivity was weak.

EXAMPLE 6

With respect to a bonding article obtained by the same method as that in Example 1, except that copper (Cu) was added in place of the Al—Ti—B alloy, the same evaluation as that in Example 1 was carried out. As a result, the grain size of aluminum on the reverse of the aluminum base plate was in the range of from about 5 mm to about 10 mm. In addition, no bonding failure was detected on the bonding interface between the aluminum circuit plate and the ceramic substrate and on the bonding interface between the ceramic substrate and the aluminum base plate, and no crack was observed on the ceramic substrate. In addition, the variation in warpage before and after heating was in the range of −50 μm to 50 μm and was not so great. Also after heat cycles were repeatedly carried out three thousands times, no bonding failure was detected, and no crack was observed on the ceramic substrate. Moreover, the thermal conductivity of a sample cut out of the obtained bonding article was 221 W/mK, and the drop in thermal conductivity from the thermal conductivity (238 W/mK) of pure aluminum was only about 7% of the thermal conductivity of pure aluminum, so that the influence of the additive on the drop in thermal conductivity was weak.

EXAMPLE 7

With respect to a bonding article obtained by the same method as that in Example 1, except that a substrate of 96% alumina having a size of 40 mm×40 mm×0.25 mm was used as the ceramic substrate, the same evaluation as that in Example 1 was carried out. As a result, the grain size of aluminum on the reverse of the aluminum base plate was in the range of from about 1 mm to about 3 mm. In addition, no bonding failure was detected on the bonding interface between the aluminum circuit plate and the ceramic substrate and on the bonding interface between the ceramic substrate and the aluminum base plate, and no crack was observed on the ceramic substrate. Also after heat cycles were repeatedly carried out three thousands times, no bonding failure was detected, and no crack was observed on the ceramic substrate. In this case, the maximum difference in level on the grain boundary portions of aluminum was 100 μm or less.

Comparative Example 1

With respect to a bonding article obtained by the same method as that in Example 1, except that the Al—Ti—B alloy was not added, the same evaluation as that in Example 1 was carried out. As a result, the grain size of aluminum on the reverse of the aluminum base plate was so great as to be in the range of from about 5 mm to about 50 mm. In addition, no bonding failure was detected on the bonding interface between the aluminum circuit plate and the ceramic substrate and on the bonding interface between the ceramic substrate and the aluminum base plate, and no crack was observed on the ceramic substrate. In addition, the variation in warpage before and after heating was so great as to be in the range of −100 μm to 50 μm. Also after heat cycles were repeatedly carried out three thousands times, no bonding failure was detected, and no crack was observed on the ceramic substrate.

Comparative Example 2

With respect to a bonding article obtained by the same method as that in Example 6, except that the Al—Ti—B alloy was not added, the same evaluation as that in Example 1 was carried out. As a result, the grain size of aluminum on the reverse of the aluminum base plate was so great as to be in the range of from about 5 mm to about 50 mm. In addition, no bonding failure was detected on the bonding interface between the aluminum circuit plate and the ceramic substrate and on the bonding interface between the ceramic substrate and the aluminum base plate, and no crack was observed on the ceramic substrate. In addition, after heat cycles were repeatedly carried out three thousands times, no bonding failure was detected, but cracks were produced on the ceramic substrate. In this case, the maximum difference in level on the grain boundary portions of aluminum was about 300 μm, and portions in which the cracks were produced on the ceramic substrate substantially corresponded to portions in which the difference in level on the grain boundary portions of aluminum was great.

According to the first preferred embodiment of the present invention, when an aluminum/ceramic bonding substrate is produced by bonding an aluminum member directly to a ceramic substrate by the molten metal bonding method, an additive for decreasing the grain size of the aluminum member to 10 mm or less while preventing the drop in thermal conductivity of the aluminum member from the thermal conductivity of a member of pure aluminum from exceeding 20% of the thermal conductivity of the member of pure aluminum is added to molten aluminum. Thus, it is possible to decrease the grain size of the aluminum member to decrease the variation in grain size distribution of the aluminum member to prevent cracks from being produced in the ceramic substrate after heat cycles, and it is possible to control the warpage of the aluminum base member due to heat when semiconductor chips or the like are soldered thereon, so that it is possible to inhibit the heat sink characteristic of the aluminum base member from deteriorating when a radiating fin or the like is mounted thereon.

Second Preferred Embodiment

In the second preferred embodiment of a method for producing an aluminum/ceramic bonding substrate according to the present invention, when an aluminum/ceramic bonding substrate having an aluminum alloy member of an aluminum-silicon alloy bonded to a ceramic substrate is produced by the molten metal bonding method, boron (B) is added to the aluminum-silicon alloy (Al—Si) to decrease the grain size of the aluminum alloy member to inhibit the hot cracks of the aluminum alloy member and to disperse silicon therein. In addition, the grain size is decreased to inhibit local waviness from being produced in the grain boundary portions on the surface of the aluminum alloy member by heat cycles. Thus, it is considered that, when a heat sink plate and semiconductor chips are soldered on the aluminum alloy member, it is possible to inhibit solder cracks from being produced by heat cycles, so that it is possible to improve the reliability of the aluminum/ceramic bonding substrate. Conventional aluminum/ceramic bonding substrates are produced while controlling cooling conditions, since cooling conditions, such as a cooling rate, greatly influence on the deposition (concentration) of silicon. However, for example, even if cooling conditions are intended to be controlled so as to carry out rapid cooling to decrease the grain size, it is difficult to carry out such control due to a problem in that the heat capacity of a mold is great and other problems. On the other hand, in the second preferred embodiment of a method for producing an aluminum/ceramic bonding substrate according to the present invention, it is possible to disperse silicon by adding boron, so that it is possible to carry out cooling in a relatively wide range of cooling conditions to improve productivity. That is, it is possible to improve the reliability, productivity and yields of an aluminum/ceramic bonding substrate while maintaining original characteristics of an aluminum-silicon alloy.

The aluminum-silicon alloy preferably contains 0.1 to 1.5 wt % of silicon, more preferably contains 0.2 to 1.0 wt % of silicon, and most preferably contains 0.2 to 0.6 wt % of silicon. In these ranges, the aluminum-silicon alloy has a desired high thermal conductivity and a suitable hardness as an aluminum-silicon alloy used for an aluminum/ceramic bonding substrate. That is, due to the heat radiation of chips mounted on the aluminum/ceramic bonding substrate, the aluminum-silicon alloy preferably has a high thermal conductivity of 170 W/m·K or more, and more preferably has a high thermal conductivity of 200 W/m·K or more. If the aluminum-silicon alloy is too soft, there is the possibility that solder cracks may be produced by thermal shocks, such as heat cycles, when the heat sink plate and chips are soldered on the aluminum/ceramic bonding substrate. On the other hand, if the aluminum-silicon alloy is too hard, there are some cases where the ceramic substrate may be broken by thermal shocks, such as heat cycles. Therefore, the surface of the aluminum-silicon alloy preferably has a Vickers hardness of Hv 25 to 40. In order for the aluminum-silicon alloy to have such a high thermal conductivity and a suitable hardness, the aluminum-silicon alloy contains the above described range of silicon.

Boron (B) has the function of decreasing the grain size of the aluminum-silicon alloy to disperse silicon to prevent hot cracks in the aluminum-silicon alloy. The amount of B to be added is preferably 0.02 wt % or more, and more preferably in the range of from 0.02 to 0.10 wt %. If the amount of B to be added is less than 0.02 wt %, the function of decreasing the grain size is small, and if the amount of B to be added is 0.02 wt % or more, it is possible to sufficiently obtain the function of decreasing the grain size. Moreover, if the amount of B to be added is in the range of from 0.02 to 0.10 wt %, it is possible to prevent the thermal conductivity of the aluminum-silicon alloy from being deteriorated by excessively adding B, and it is possible to prevent the aluminum-silicon alloy from being too hard by excessively adding B. In addition, it is possible to prevent expensive B from being excessively added. If the amount of B to be added is in the above described range, it is possible to prevent the thermal conductivity from being deteriorated by the addition of B, and it is possible to prevent the rise in hardness due to the addition of B.

The bonding of the aluminum alloy plate to the ceramic substrate is preferably carried out by the molten metal bonding method. In the second preferred embodiment of a method for producing an aluminum/ceramic bonding substrate according to the present invention, it is possible to obtain a good aluminum/ceramic bonding substrate without controlling any special cooling conditions and without using any special equipments. Usually, in the molten metal bonding method, when the aluminum alloy plate is cooled after being bonded to the ceramic substrate, it is difficult to increase the cooling rate in view of equipments, e.g., if cooling conditions are controlled. Therefore, it is considered that the grain size is a great grain size of, e.g., a few centimeters, so that silicon easily concentrates on the grain boundary portions since the area of the grain boundary portions is small. Moreover, it was found that it is not possible to remove the silicon during etching, so that there are some cases where there is a problem on electric insulation. In the second preferred embodiment of a method for producing an aluminum/ceramic bonding substrate according to the present invention, it is possible to decrease the grain size to 1 mm or less, and to 0.5 mm or less, by adding a suitable amount of B. In addition, it is possible to macroscopically disperse silicon, and it is possible to remove an undesired portion of the aluminum alloy plate without causing any problems. That is, it is considered that, although the portions having a high concentration of silicon remain being produced in the grain boundary portions even if the grain size is decreased, silicon is dispersed as a whole so as not to form the enriching section of silicon having an extremely high concentration of silicon since the grain boundary portions exist in a network structure. In addition, it is considered that silicon is removed with exclusive chemicals if silicon remains adhering to the ceramic substrate. However, there is a problem in that the enriching section of silicon adhering to the substrate can not be removed with iron chloride and copper chloride which can be suitably mass-produced. In the second preferred embodiment of a method for producing an aluminum/ceramic bonding substrate according to the present invention, this problem can be solved.

Moreover, in the second preferred embodiment of a method for producing an aluminum/ceramic bonding substrate according to the present invention, the hardness of the aluminum-silicon alloy is set to be in the above described range, and the grain size is decreased, so that it is possible to inhibit solder cracks from being produced after heat cycles. Conventionally, there are some cases where solder cracks are produced in the heat cycle test by the production of stress which is considered to be caused by the difference in thermal expansion between the aluminum-silicon alloy and solder. It is considered that solder cracks are produced by great "waviness (wrinkle)" which is produced in the grain boundary portions on the surface of the aluminum-silicon alloy by heat cycles, so that it is required to decrease the waviness. In the second preferred embodiment of a method for producing an aluminum/ceramic bonding substrate according to the present invention, it is considered that the grain size is decreased to increase the number of grain boundary portions, in which the waviness is produced, to disperse portions in which the waviness is produced, so that it is possible to decrease the waviness and it is possible to inhibit solder cracks from being produced.

As described above, if the heat sink plate and chips are soldered on the aluminum/ceramic bonding substrate, it is possible to considerably prevent solder cracks from being produced, so that it is possible to prevent the heat sink characteristic from deteriorating. In this case, since the solder wettability of the aluminum alloy plate is not good, the heat sink plate and chips are preferably soldered on the surface of the aluminum alloy plate after the whole portion or predetermined portion of the surface of the aluminum alloy plate is plated with nickel or a nickel alloy.

When the aluminum alloy plate is bonded to the ceramic substrate by the molten metal bonding method, a conventional producing system disclosed in, e.g., Japanese Patent Laid-Open No. 2002-329814, may be applied as it is. Thus, the second preferred embodiment of an aluminum/ceramic bonding substrate according to the present invention can be produced without providing any new production equipment and without greatly improving the existing production equipment.

The second preferred embodiment of an aluminum/ceramic bonding substrate according to the present invention is used for producing a power module by usual assembling steps, e.g., steps of soldering a heat sink plate and chips, wiring by wire bonding or the like, bonding a plastic package, and injecting an insulating gel.

Referring to the accompanying drawings, Examples in the second preferred embodiment of an aluminum/ceramic bonding substrate and a method for producing the same according to the present invention will be described below.

EXAMPLE 8

A mold housing therein an aluminum nitride substrate was put in a furnace to be heated to 740° C. in an atmosphere of nitrogen. Then, molten aluminum containing 0.5 wt % of silicon and 0.04 wt % of boron was injected into the mold while removing oxide films. Thereafter, the mold was cooled to solidify the molten metal, and further cooled to a room temperature. Thus, there was produced a bonding article wherein an aluminum alloy plate 112 having a thickness of 0.15 mm and an aluminum alloy plate 112 having a thickness of 0.4 mm were bonded directly to both sides of a ceramic substrate 110, respectively, and the bonding article was taken out of the mold. Thereafter, the surface of the aluminum alloy plates 112 was polished, and etching resists having a predetermined shape were printed thereon. Then, the aluminum alloy plates 112 were etched with a ferric chloride solution to form a circuit pattern as shown in FIGS. 1 and 2.

The mean grain size of the alloy on the surface of the aluminum alloy plates 112 of the bonding article thus obtained was measured. As a result, the mean grain size was about 200 to 300 μm, and the deposition (remaining) of silicon was not observed on the surface of the ceramic substrate 110.

The Vickers hardness of the aluminum alloy plate 112 was Hv 29.4, the volume resistivity thereof was 2.89 μΩcm, and the thermal conductivity thereof measured by the laser flash method was 191 W/mK.

With respect to the obtained bonding article, the bonding interface between the aluminum alloy plate 112 and the ceramic substrate 110 was examined by an ultrasonic detector. Then, no bonding failure was detected, and no crack was observed on the ceramic substrate 110.

Moreover, with respect to the obtained bonding article, an Ni—P electroless plating layer having a thickness of 3 μm was formed on the aluminum alloy plates 112, and heat cycles (in each cycle of which the article was held at −40° C. for 30 minutes, at 25° C. for 10 minutes, at 125° C. for 30 minutes, and at 25° C. for 10 minutes) were repeatedly carried out three thousands times. Thereafter, the above described bonding interface was examined by the ultrasonic detector. Then, no bonding failure was detected, and no crack was observed on the ceramic substrate 110. In addition, fine waviness was uniformly produced on the aluminum alloy plate 112. Since such fine waviness was newly uniformly produced, stress applied on the solder was decreased when the heat sink plate was soldered on the aluminum alloy plate 112.

EXAMPLES 9 THROUGH 12

With respect to bonding articles obtained by the same method as that in Example 8, except that the amount of boron to be added was 0.03 wt % (Example 9), 0.06 wt % (Example 10), 0.08 wt % (Example 11) and 0.10 wt % (Example 12), respectively, the same evaluation as that in Example 8 was carried out. As a result, the grain size of the alloy was extremely decreased when the amount of boron to be added was 0.03 wt % or more. When the amount of boron to be added was 0.06 wt % or more, the degree of the decrease of the grain size of the alloy was not particularly changed in comparison with Examples 8 and 9.

EXAMPLE 13

With respect to a bonding article obtained by the same method as that in Example 8, except that an aluminum alloy containing 0.1 wt % of silicon and 0.05 wt % of boron was used, the same evaluation as that in Example 8 was carried out. As a result, the mean grain size of the alloy on the surface of the aluminum alloy plate 112 was about 200 to 300 μm, and the deposition (remaining) of silicon was not observed on the surface of the ceramic substrate 110. In addition, the Vickers hardness of the aluminum alloy plate 112 was Hv 22.0.

EXAMPLE 14

With respect to a bonding article obtained by the same method as that in Example 8, except that an aluminum alloy containing 0.2 wt % of silicon and 0.05 wt % of boron was used, the same evaluation as that in Example 8 was carried out. As a result, the mean grain size of the alloy on the surface of the aluminum alloy plate 112 was about 200 to 300 μm, and the deposition (remaining) of silicon was not observed on the surface of the ceramic substrate 110. In addition, the Vickers hardness of the aluminum alloy plate 112 was Hv 25.4.

EXAMPLE 15

With respect to a bonding article obtained by the same method as that in Example 8, except that an aluminum alloy containing 1.0 wt % of silicon and 0.05 wt % of boron was used, the same evaluation as that in Example 8 was carried out. As a result, the mean grain size of the alloy on the surface of the aluminum alloy plate 112 was about 200 to 300 µm, and the deposition (remaining) of silicon was not observed on the surface of the ceramic substrate 110. In addition, the Vickers hardness of the aluminum alloy plate 112 was Hv 37.2.

Comparative Example 3

With respect to a bonding article obtained by the same method as that in Example 8, except that boron was not added, the same evaluation as that in Example 8 was carried out. As a result, the mean grain size of the alloy on the surface of the aluminum alloy plate 112 was a very large mean grain size of about 3 cm, and dendrites were produced in crystal grains.

The Vickers hardness of the aluminum alloy plate was Hv 29.0, the volume resistivity thereof was 2.94 µΩcm, the thermal conductivity thereof was 196 W/mK. In addition, after 3000 heat cycles, great local waviness was produced on the aluminum alloy plate. Such great local waviness causes solder cracks during soldering. Moreover, there were many portions in which silicon was linearly deposited, and the rate of occurrence of cracks was high in these portions.

If Comparative Example 3 with Examples 8 through 15, the grain size of the alloy can be greatly decreased to increase the number of grain boundary portions by adding boron to the aluminum-silicon alloy in Examples 8 through 15, so that silicon can be uniformly dispersed in many grain boundary portions to inhibit the production of the portions in which silicon is linearly deposited (concentrated) as Comparative Example 3. In addition, the Vickers hardness, volume resistivity and thermal conductivity of the aluminum alloy plate are not so changed, so that it can be revealed that the aluminum-silicon alloy in any one of Examples 8 through 15 remains having the same advantageous characteristics as the above described characteristics in Comparative Example 3.

Comparative Example 4

With respect to a bonding article obtained by the same method as that in Example 8, except that the amount of boron to be added was 0.01 wt %, the same evaluation as that in Example 8 was carried out. As a result, since the amount of boron to be added was too small, the grain size of the alloy was great, so that great waviness was produced after thousand heat cycles. Such great waviness causes the production of solder cracks during soldering. Therefore, it can be revealed that, if the amount of boron to be added is 0.01 wt %, it is too small to decrease the grain size of the alloy.

According to the second preferred embodiment of the present invention, it is possible to decrease the grain size of the aluminum-silicon alloy of the aluminum alloy member bonded to the ceramic substrate, so that it is possible to increase the number of grain boundary portions of the aluminum-silicon alloy to disperse silicon to prevent silicon from remaining on the surface of the ceramic substrate. Thus, it is possible to prevent the aluminum alloy member from being hot-cracked, and it is possible to improve the insulating characteristics of the aluminum/ceramic bonding substrate, so that it is possible to improve the yield of the aluminum/ceramic bonding substrate. If a heat sink plate is soldered on the aluminum/ceramic bonding substrate, it is possible to prevent solder cracks from being produced by heat cycles, so that it is possible to prevent the heat sink characteristic of the heat sink plate from deteriorating. Moreover, it is possible to prevent cracks from being produced in the ceramic substrate. Thus, it is possible to improve the heat cycle resistance (reliability) of the aluminum/ceramic bonding substrate.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An aluminum/ceramic bonding substrate comprising:
a ceramic substrate; and
an aluminum member bonded directly to said ceramic substrate, said aluminum member containing an additive for decreasing a grain size of the aluminum member to 10 mm or less while preventing a drop in thermal conductivity of the aluminum member from a thermal conductivity of a member of pure aluminum from exceeding 20% of the thermal conductivity of the member of pure aluminum, said additive being an alloy containing titanium and boron, and said aluminum member containing 0.1 to 0.5 wt % of titanium,
wherein said aluminum member has a thermal conductivity which is 80% or more of a thermal conductivity of a member of pure aluminum, and said aluminum member has a grain size of 10 mm or less.

2. An aluminum/ceramic bonding substrate as set forth in claim 1, wherein the thermal conductivity of said aluminum member is 90% or more of the thermal conductivity of the member of pure aluminum.

3. An aluminum/ceramic bonding substrate as set forth in claim 1, wherein the grain size of said aluminum member is 3 mm or less.

4. An aluminum/ceramic bonding substrate as set forth in claim 1, wherein said aluminum member is bonded directly to said ceramic substrate by cooling molten aluminum which contacts said ceramic substrate.

5. An aluminum/ceramic bonding substrate comprising:
a ceramic substrate; and
an aluminum member bonded to said ceramic substrate, said aluminum member including an additive and having a thermal conductivity which is 80% or more of a thermal conductivity of a member of pure aluminum, and said aluminum member having a grain size of 10 mm or less,
wherein said additive is calcium, strontium or aluminum nitride.

6. An aluminum/ceramic bonding substrate as set forth in claim 5, wherein said additive has a content of 0.3 to 0.7 wt %.

* * * * *